United States Patent
Tang et al.

(10) Patent No.: US 10,528,421 B2
(45) Date of Patent: Jan. 7, 2020

(54) PROTECTION SCHEME CONVERSION

(71) Applicant: Arteris, Inc., Campbell, CA (US)

(72) Inventors: Monica Tang, San Jose, CA (US); Xavier van Ruymbeke, Issy les Moulineaux (FR)

(73) Assignee: ARTERIS, INC., Campbell, CA (US)

( * ) Notice: Subject to any disclaimer, the term of this patent is extended or adjusted under 35 U.S.C. 154(b) by 0 days.

(21) Appl. No.: 14/983,528

(22) Filed: Dec. 29, 2015

(65) Prior Publication Data
US 2017/0185477 A1 Jun. 29, 2017

(51) Int. Cl.
| | |
|---|---|
| H03M 13/00 | (2006.01) |
| G06F 11/10 | (2006.01) |
| H03M 13/29 | (2006.01) |
| H03M 13/35 | (2006.01) |
| G11C 29/52 | (2006.01) |
| G11C 29/04 | (2006.01) |

(52) U.S. Cl.
CPC ..... *G06F 11/1068* (2013.01); *H03M 13/2906* (2013.01); *H03M 13/356* (2013.01); *G11C 29/52* (2013.01); *G11C 2029/0411* (2013.01)

(58) Field of Classification Search
CPC ............. G06F 11/1068; G06F 11/3476; G06F 11/348; G06F 11/349; G06F 12/00; G06F 12/08; G06F 13/00; G06F 2201/87; G06F 2213/00; G06F 9/46; G11C 29/52; H03M 13/2906; H03M 13/356; H04L 12/28; H04L 12/56
See application file for complete search history.

(56) References Cited

U.S. PATENT DOCUMENTS

| | | | | |
|---|---|---|---|---|
| 6,675,243 | B1 * | 1/2004 | Bastiani | G06F 13/4291 710/105 |
| 2007/0168768 | A1 * | 7/2007 | Galbi | G06F 11/1032 714/701 |
| 2010/0080229 | A1 * | 4/2010 | Scandurra | H04L 49/10 370/392 |
| 2011/0307758 | A1 * | 12/2011 | Fillingim | G06F 11/1048 714/758 |
| 2013/0145227 | A1 * | 6/2013 | Palaniappan | H03M 13/19 714/746 |
| 2013/0159595 | A1 * | 6/2013 | Zhou | G06F 13/4022 710/317 |
| 2013/0275804 | A1 * | 10/2013 | Lee | G06F 11/08 714/15 |

(Continued)

*Primary Examiner* — Albert Decady
*Assistant Examiner* — Enamul M Kabir
(74) *Attorney, Agent, or Firm* — Dana Legal Services; Jubin Dana; John Dahnad

(57) ABSTRACT

Systems-on-chip are designed with different IPs that use different data protection schemes. Modules are used between the IPs, and the modules convert between protection schemes. Protection schemes can be per-byte, word, packet, flit, or burst. Conversion can involve splitting, merging, encapsulation, conversion, and generation of redundant information. Encoding of redundancy according to protection schemes can occur directly at an IP interface or within an interconnect, such as within a packet-based NoC. Designs include SoCs, hardware description language code describing functions within SoCs, and non-transient computer readable media that store such source code.

26 Claims, 12 Drawing Sheets

| data bits | bits for SEC ECC | bits for SECDED ECC |
|---|---|---|
| 1 | 2 | 3 |
| 2-4 | 3 | 4 |
| 5-11 | 4 | 5 |
| 12-26 | 5 | 6 |
| 27-57 | 6 | 7 |
| 58-120 | 7 | 8 |
| 121-247 | 8 | 9 |
| 248-502 | 9 | 10 |

(56) References Cited

U.S. PATENT DOCUMENTS

| | | | |
|---|---|---|---|
| 2014/0052919 A1* | 2/2014 | Moll | G06F 12/1036 711/122 |
| 2015/0103822 A1* | 4/2015 | Gianchandani | G06F 15/7825 370/389 |
| 2015/0324319 A1* | 11/2015 | Leidel | G06F 13/1673 711/148 |

* cited by examiner

| data bits | bits for SEC ECC | bits for SECDED ECC |
|---|---|---|
| 1 | 2 | 3 |
| 2-4 | 3 | 4 |
| 5-11 | 4 | 5 |
| 12-26 | 5 | 6 |
| 27-57 | 6 | 7 |
| 58-120 | 7 | 8 |
| 121-247 | 8 | 9 |
| 248-502 | 9 | 10 |

FIG. 1

```
module encoder(
    input data_in[31:0],
    input parity_in[3:0],
    output data_out[31:0],
    output ecc_out[6:0]
);

endmodule
```

PROTECTION SCHEME CONVERSION

FIELD OF THE INVENTION

The invention is in the field of system-on-chip and, more specifically, schemes for data error protection.

BACKGROUND

Protection schemes involve encoding redundant information with data for transmission or storage, and later checking that the data and redundant information are consistent. Numerous protection schemes are well known, including triplication, parity, error correction codes (ECC), and 8b10b encoding. Protection schemes apply to any of source data, addresses, packet headers, and other useful transferred information, all of which are data in the context of adding redundant information.

Different protection schemes have different amounts of redundant information, such as two bits per bit of data for triplication, one bit per byte of data for per-byte parity, one bit per multi-byte word of data for per-word parity, four bits per byte of data for per-byte ECC providing a protection level of single error correction (SEC), or five bits per byte of data for per-byte ECC providing a protection level of single error correction and double error detection (SECDED). A byte is eight bits. FIG. 1 shows a table of the number of bits of redundant information needed to provide SEC ECC and SECDED ECC for ranges of numbers of data bits.

Systems-on-chips (SoCs) are designed with hardware description language (HDL) code. Verilog, SystemVerilog, very high-speed integrated circuit hardware description language (VHDL), and SystemC are HDLs.

Some applications of SoCs, such as automobile safety systems, industrial automation equipment, and data centers require that on-chip data, processing, storage, and communication functions are error resilient. That means that they if their physical structures wear out over time or they have manufacturing defects or they are impacted by alpha particle radiation that causes data to become corrupted, that corruption will be detected or detected and corrected.

Modern SoCs include semiconductor intellectual property (IP) cores, integrated in communication with each other, to perform different useful functions. Some common IPs are central processing units (CPU)s, dynamic random access memory (DRAM) controllers, static random access memory (SRAM) buffers, graphics processing units (GPU)s, and direct memory access (DMA) engines. Most modern SoCs connect the IPs using an interconnect IP. Some common types of interconnects are crossbars, networks-on-chip (NoC)s, and meshes. SoC designers often procure such IPs from third-party IP vendors who provide HDL source code.

IPs designed for SoCs for error resilient applications use parity or ECC or other types of protection schemes. However, different IPs use different protection schemes. For example a CPU master IP, such as the 32-bit ARM R5 CPU, can uses 32-bit SECDED ECC scheme and a 128-bit Flash memory controller can use a 128-bit SECDED ECC scheme. What is needed is a way for the two to be properly connected in an SoC. Furthermore, what is needed is a way to make an interconnect IP configurable as HDL code in order to provide for connecting IPs with inherently incompatible protection schemes.

SUMMARY OF THE INVENTION

The invention pertains to chips, systems, method, and HDL code that perform conversion between protection schemes. Embodiments of the invention enable IPs that use different protections schemes to communicate. An encoder unit accomplishes this by receiving redundant information according to one scheme and encoding either the same or different redundant information according to another scheme. This is useful in interconnects within SoCs. In some embodiments the interconnect uses a protection scheme that is the same as one of the IPs but in other embodiments the interconnect uses a unique protection scheme.

The invention also encompasses the challenge of data changing within the interconnect, such as due to a change in serialization due to a decrease in data bus width, or a firewall that modifies a packet header. In either case, in each of some protection schemes, correctness must be checked and redundant information recalculated within the interconnect.

The hardware design and the method of operation of SoCs can embody the invention. Furthermore, HDL code can embody the invention and one or more non-transient computer readable media that store such HDL code can embody the invention. HDL code that is a parity conversion placeholder embodies the invention, as it provides another designer the interfaces that enable communication between heterogeneous IPs that use different protection schemes. Some third-party interconnect configuration tools generate such HDL code in order to enable chip designers to implement application-specific protection scheme conversion.

Some embodiments encapsulate the redundant information received from a receiving interface within the information sent on the sending interface. Some embodiments convert the form of the same redundant information received on the receiving interface as the information sent on the sending interface. Some embodiments receive redundant information, perform a consistency check, encode different redundant information, and send that.

Some embodiments assert a signal, such as in the form of a pulse, when a checker detects an error. Some embodiments check consistency and count errors detected. Some embodiments that use ECC count errors corrected, and separately count uncorrected errors.

Encoders embody the invention if the convert from any one to any other protection scheme. This includes conversion from or to any of parity, ECC, a different form of parity, a different form of ECC, SEC ECC, and SECDED ECC. Furthermore, some embodiments apply a protection scheme per-byte, some per-word, some per flow control unit (flit), some per packet, and some per burst.

Some embodiments apply protection schemes per multibyte word, but split the redundant information and transport each portion with a different byte. This is helpful if word size and re-serialization changes are present in the interconnect. Some embodiments encode other sideband information that relates to the data transfer, but is no part of the protection scheme with the received or sent data. Some such sideband information is status, control commands, and credits.

Some encoders according to the invention receive data of one word size and send data of another word size. Accommodating such data width conversion necessitates protection scheme conversion.

BRIEF DESCRIPTION OF THE DRAWINGS

FIG. 1 a table of the number of bits of redundant information needed for SEC ECC and for SECDED ECC for ranges of data bits.

DETAILED DESCRIPTION

The invention is described in accordance with the aspects and embodiments in the following description with reference to the FIGs., in which like numbers represent the same or similar elements. Reference throughout this specification to "one embodiment," "an embodiment," or similar language means that a particular feature, structure, or characteristic described in connection with the embodiment is included in at least one embodiment of the invention. Thus, appearances of the phrases "in one embodiment," "in an embodiment," "in certain embodiments," and similar language throughout this specification may, but do not necessarily, all refer to the same embodiment. It is noted that, as used in this description, the singular forms "a," "an" and "the" include plural referents, unless the context clearly dictates otherwise.

The described features, structures, or characteristics of the invention may be combined in any suitable manner in accordance with the aspects and one or more embodiments of the invention. In the following description, numerous specific details are recited to provide an understanding of various embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring the aspects of the invention.

All publications and patents cited in this specification are herein incorporated by reference as if each individual publication or patent were specifically and individually indicated to be incorporated by reference and are incorporated herein by reference to disclose and describe the methods and/or system in connection with which the publications are cited. The citation of any publication is for its disclosure prior to the filing date and should not be construed as an admission that the invention is not entitled to antedate such publication by virtue of prior invention. Further, the dates of publication provided may be different from the actual publication dates, which may need to be independently confirmed.

Figure 2:
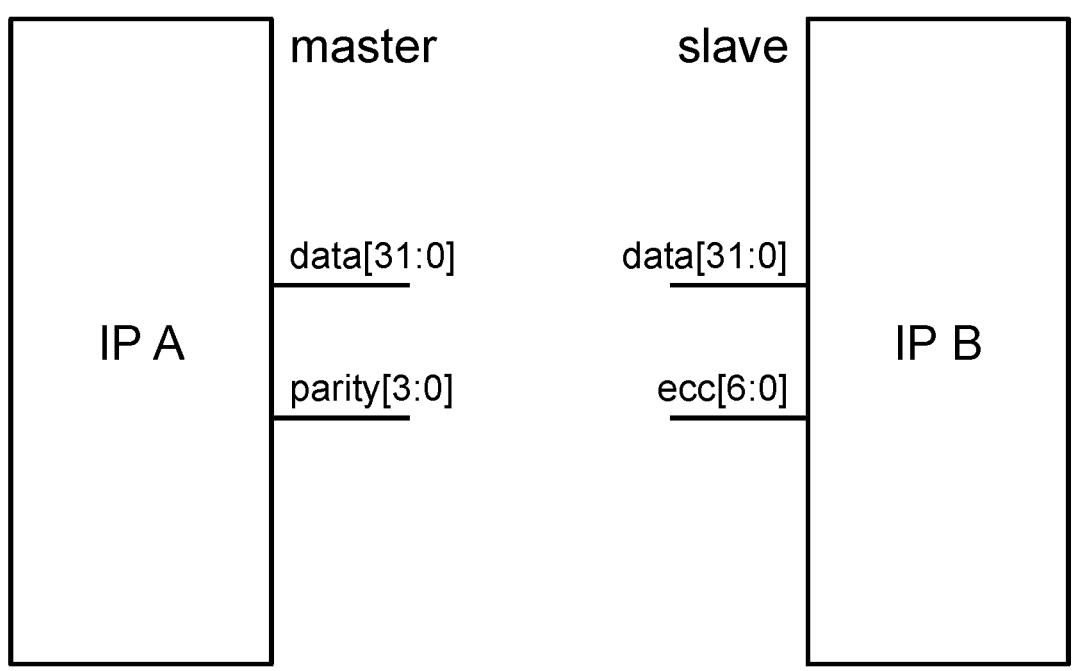
FIG. 2 illustrates a master and a slave IP core, each with different protection schemes.

Many SoCs include IPs with interfaces for sending and receiving data. As shown in FIG. 2, each interface is either a master type or a slave type, each of which is designed to be coupled to the other. Interfaces include various signals, as prescribed by protocols, and data is normally one of the signals. Other signals, which are involved in controlling the exchange of data between masters and slaves, are omitted from interfaces depicted in the figures of this patent.

Each data signal has an inherent number of bits, also known as the width or the size of the signal. Bits of signals are conventionally indexed starting at zero. Therefore, a 32-bit signal has bits 0 to 31, which are notated, as in FIG. 2, [31:0]. Data protection is part of some interface protocols. Some protocols encode the redundant information within the data signal, but many protocols transfer redundant information as separate signals. In FIG. 2, IP A has a 32-bit data bus and a 4-bit parity protection scheme whereas IP B has a 32-bit data bus and a 7-bit ECC protection scheme. Naturally, the interface protocols of IP A and IP B are incompatible and so the master and slave interfaces cannot be directly connected.

Figure 3A:
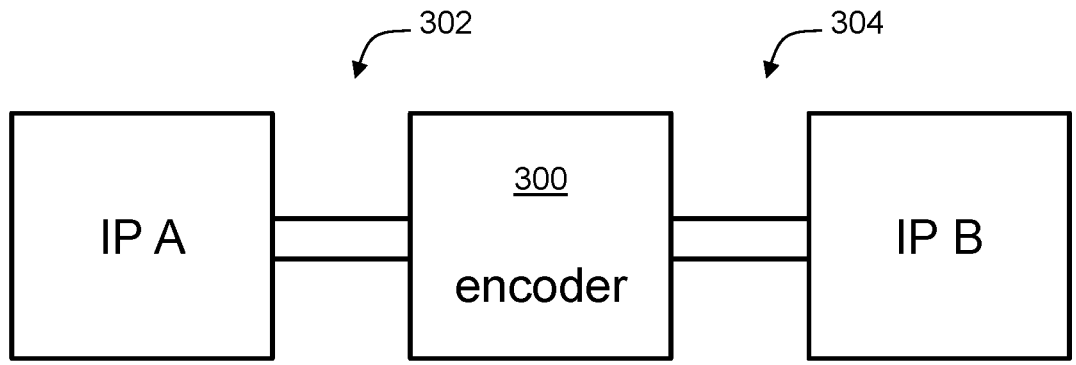
FIG. 3A illustrates two IP cores coupled through an encoder.

FIG. 3(a) shows an embodiment of the invention in which IP A and IP B are coupled through an encoder 300. IP A sends, and encoder 300 receives, data and 7-bit ECC through interface 302. The encoder 300 calculates a 4-bit party signal. Furthermore, encoder 300 sends, and IP B receives, data and 4-bit party through interface 304.

Figure 3B:
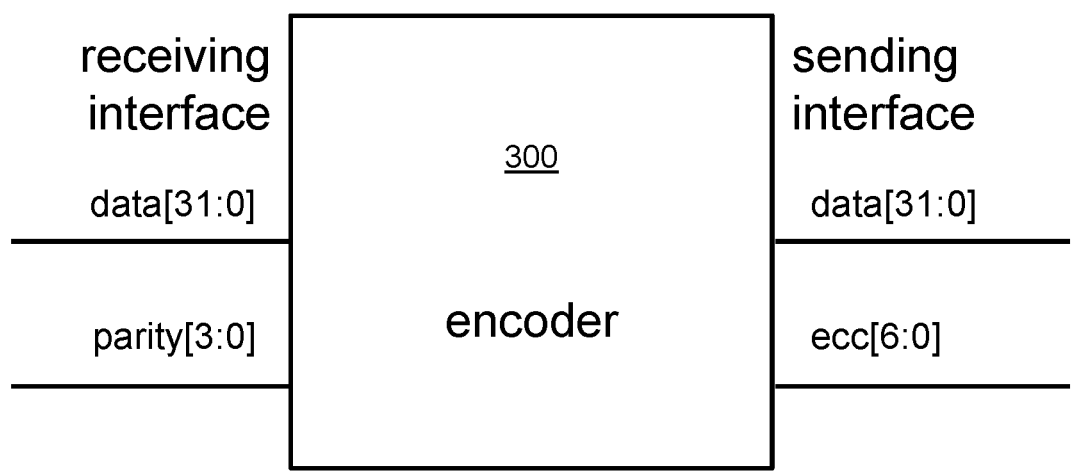
FIG. 3B illustrates an encoder with a receiving interface and a sending interface.

FIG. 3(b) shows encoder 300, which includes a receiving interface and a sending interface. The receiving interface includes a 32-bit data signal and a 4-bit parity signal. The sending interface includes a 32-bit data signal and a 7-bit ECC signal. The sending interface sends the same data values as received on the receiving interface. Different embodiments of the invention have different internal design of the encoder 300 that may use different parity encoding functions, may perform an ECC checking function, will have varying amounts of delay, and have varying other attributes of protection scheme encoding.

Figures 4A, 4B:
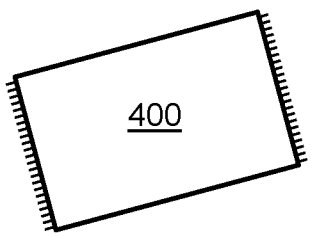
FIG. 4A illustrates a non-transient computer-readable medium.
FIG. 4B illustrates source code for a placeholder for an encoder.

FIG. 4(a) depicts a negative-and (NAND) flash memory chip 400. This is a type of non-transient computer readable medium on which source code is stored according to some embodiments of the invention. Some other embodiments use other types of computer readable media such as hard disk drives, compact disk read-only memory (CD-ROM), and punch cards.

FIG. 4(b) depicts a source code file 410 that is in accordance with some aspects of the invention. It is a module, written in the SystemVerilog HDL language. It includes inputs of a receiving interface with a 32-bit data signal and a 4-bit parity signal and it includes outputs of a sending interface with a 32-bit data signal and a 7-bit ECC signal. The aspects of the invention as embodied in this is particular embodiment of the invention is a placeholder module. It enables a designer to add code that describes the function of an encoder.

A vendor of third-party interconnect IP provides such a module to chip designers so that they are able to effectively customize the interconnect IP according to their desired error protection scheme. That way the interconnect IP provider need not learn the chip designers requirements to customize the interconnect IP and the chip designers need not redesign the interconnect IP for their requirements.

Figure 5A:
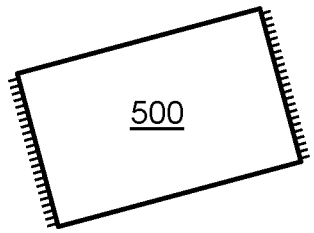
FIG. 5A illustrates a non-transient computer-readable medium.
Figure 5B:
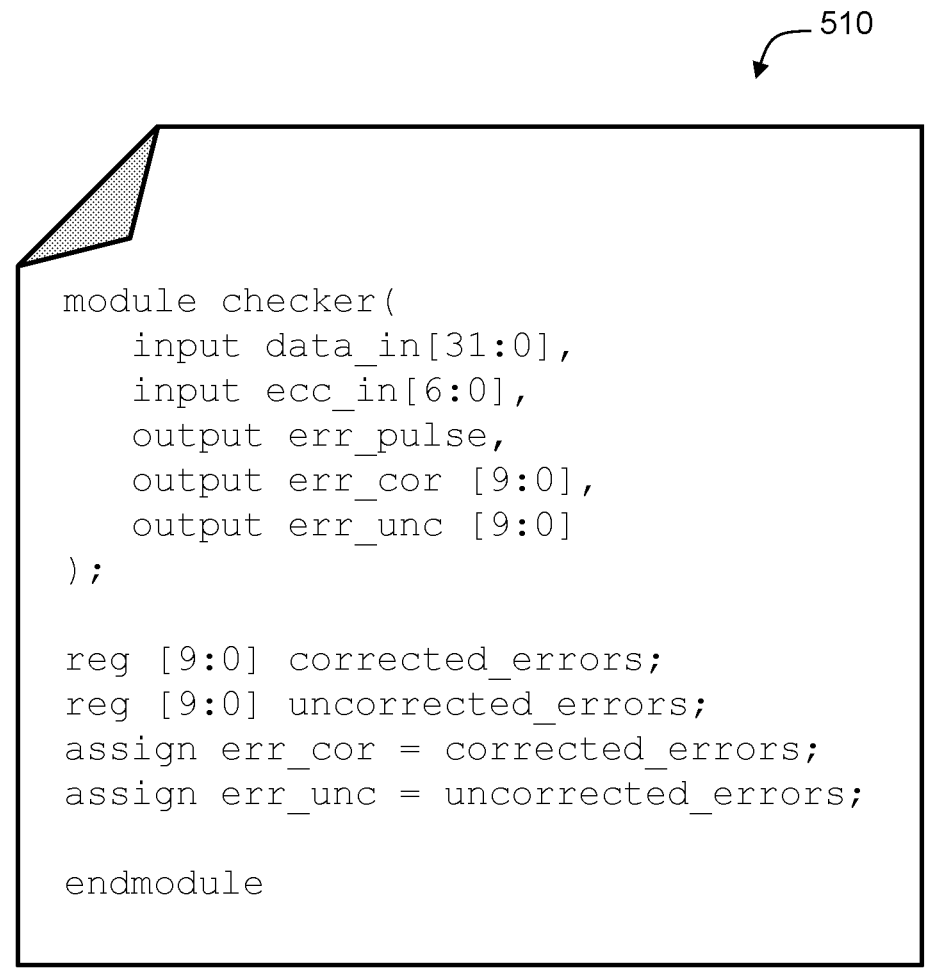
FIG. 5B illustrates source code for a placeholder for a checker.

FIG. 5(a) depicts the non-transient computer readable NAND flash memory 500, arranged to store the source code file 510, as shown in FIG. 5(b). The source code of file 510 is a SystemVerilog checker placeholder according to an aspect and embodiment of the invention. It includes a receiving interface with a 32-bit data input signal and a 7-bit ECC signal. The module further includes output signal, err_pulse, which produces a pulse when the checker detects an error. Such a pulse is useful to interrupt a CPU so that it can handle such an error condition. The module further includes output 10-bit signals err_cor and err_unc. Those signals are driven by counter registers, corrected_errors and uncorrected_errors. The placeholder code allows a chip designer to count the number of errors detected through the ECC protection scheme and count the number of errors that corrected over time.

Figure 6:
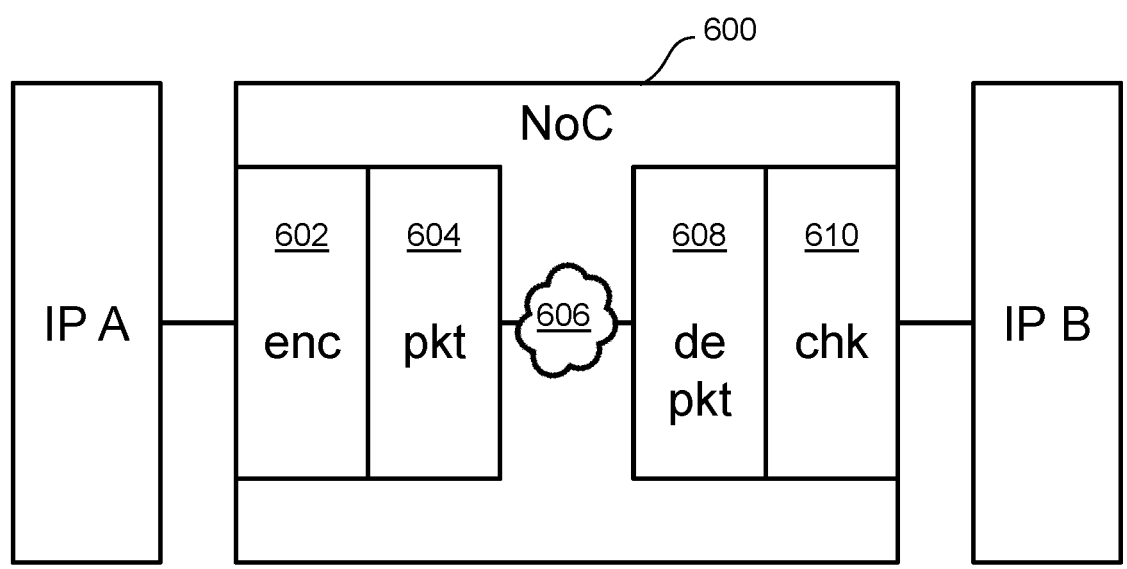
FIG. 6 illustrates IPs and a NoC within an SoC, the NoC performing encoding, packetizing, transport, depacketizing, and checking.

FIG. 6 shows IPs within a SoC according to various aspects in an embodiment of the invention. IP A is coupled to IP B through a NoC interconnect IP 600. NoC 600 facilitates and performs error resilient packet-based communication. For that, NoC 600 includes various units that operate on information sent from IP A to IP B. In sequence, encoder unit 602 generates redundant information according to a protection scheme as shown in FIG. 4. Packetizing unit 604 encodes data and redundant information in packets that include headers, and for some packets, payloads. Network 606 transports packets between IPs, and in some embodiments serves to transport packets between many IPs other than IP A and IP B. Depacketizing unit 608 receives packets from network 606 and presents the data and redundant information to checking unit 610. Checking unit 610 checks the data and redundant information for consistency, and indicates errors as shown in FIG. 6.

Figure 7:
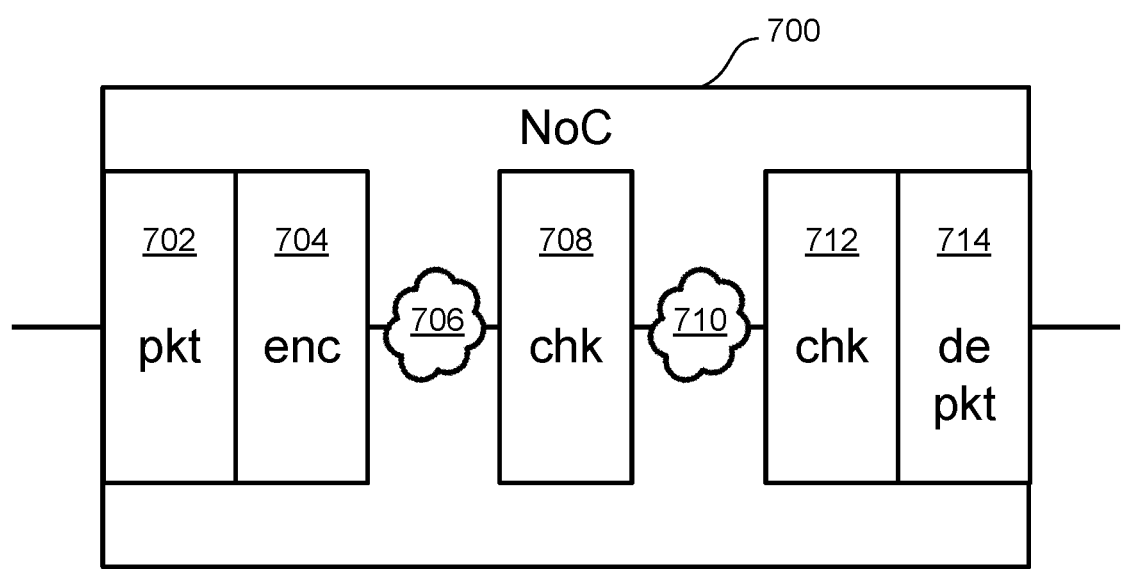
FIG. 7 illustrates a NoC that performs packetizing, encoding, transport, checking, further transport, checking, and depacketizing.

Whereas NoC 600 performs encoding before packetizing and checking after depacketizing, FIG. 7 shows a NoC 700 in which packetizing unit 702 packetizes data for transport. Encoding unit 704 calculates redundant information according to a protection scheme. Network 706 transports protected packets to checking unit 708, which checks consistency and reports errors. Network 710 transports unmodified packets to checker 712, which checks consistency and reports errors. In accordance with the aspects of the invention, different embodiments have various numbers of checkers through which packets pass within a NoC. According to the embodiment of FIG. 7, checked packets proceed through depacketizing unit 714.

Figure 8:
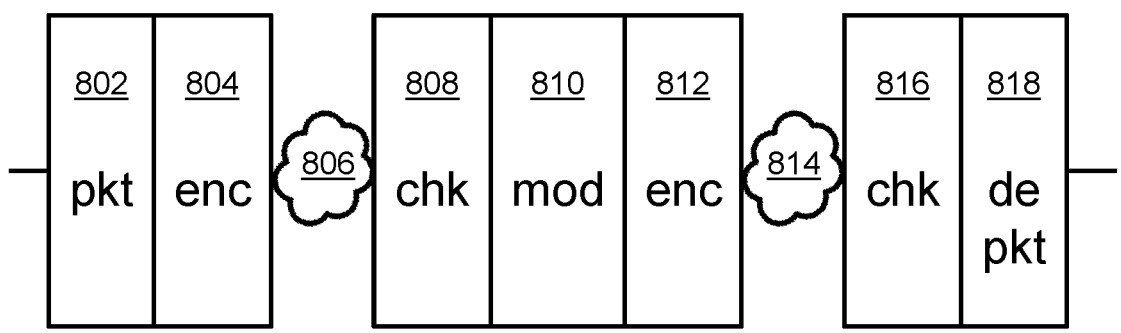
FIG. 8 illustrates units of a NoC that perform packetizing, encoding, transport, checking, modification, encoding, further transport, checking, and depacketizing.

FIG. 8 shows the units of a NoC according to aspects of invention as shown in another embodiment. Packetizing unit 802 packetizes data. Encoder unit 804 calculates redundant information and encodes protected packets. Network 806 transports packets to checker unit 808, which check consistency and reports errors. Modification unit 810 modifies the packet format. In some embodiments, modification involves changing the payload data, such as by changing the serialization and in some embodiments modification involves changing the packet header, which for the purposes of protection schemes is data from which redundant information is calculated. Encoder unit 812 calculates redundant information for the modified packet, according to a protection scheme. In some embodiments, the protection scheme used by encoding unit 804 and the protection scheme used by encoder unit 812 are the same scheme, but in some embodiments, they are different schemes. Network 814 transports packets to checking unit 816, which checks consistency and reports errors. Depacketizing unit 818 depacketizes the packets and presents the data to a connected IP.

In some embodiments, depacketizing unit 818 is a widening serialization adapter. It concatenates a multiplicity of incoming data words into a wider outgoing data word. For such, encoder unit 812 concatenates the bits of the incoming parity of multiple data words into a parity signal for the wider outgoing data word.

In some embodiments, depacketizing unit 818 is a narrowing serialization adapter. It splits incoming data words into a multiplicity of narrower outgoing data words. For such, encoder unit 812 checks a certain number of ECC bits for the wide incoming data words and encoder unit 812 encodes a smaller number of ECC bits for each narrower outgoing data word.

In some embodiments, depacketizing unit 818 is a firewall unit. It checks software-defined security bits in packet headers, and in some cases changes the state of a packet header bit. For such, encoder unit 812 encodes outgoing ECC bit values that may differ from the incoming ECC bit values, though using the same ECC protection scheme.

Figure 9:
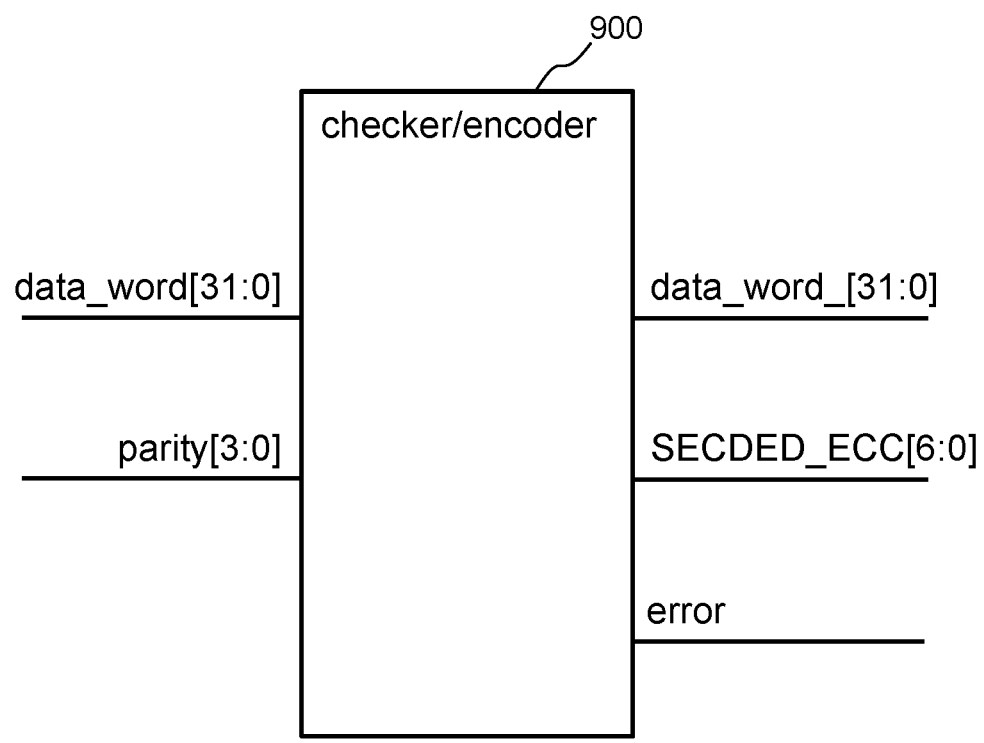
FIG. 9 illustrates a checker/encoder that receives per-byte parity and sends per-word SECDED ECC.

FIG. 9 shows a checker/encoder 900 according to an embodiment of the invention. It receives and sends 32-bit data words. Its receive interface uses a per-byte parity scheme, with one parity bit per byte of each 32-bit (4-byte) data word. The sending interface of checker/encoder 900 uses a 7-bit SECDED ECC protection scheme. SECDED ECC is calculated per 32-bit data word. Checker/encoder 900 outputs an error signal that pulses for detected errors.

Figure 10:
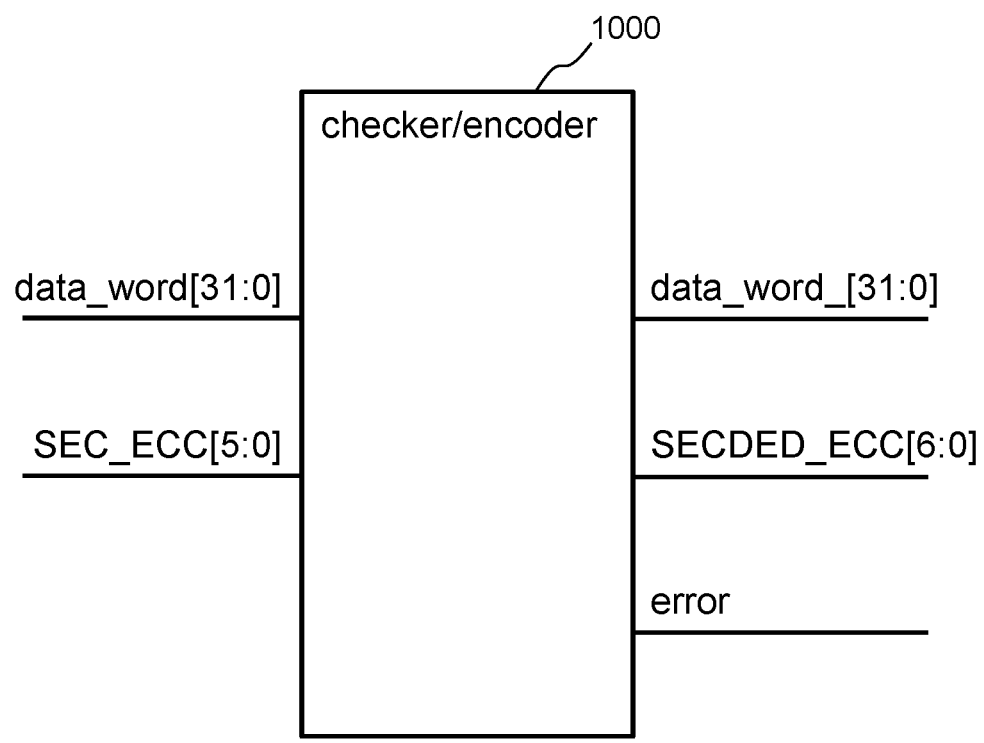
FIG. 10 illustrates a checker/encoder that receives per-word SEC ECC and sends per-word SECDED ECC.

FIG. 10 shows a checker/encoder 1000 according to an embodiment of the invention. It receives and sends 32-bit data words. Its receive interface uses a per-word SEC ECC scheme, with 6 bits per 32-bit data word. The sending interface of checker/encoder 1000 uses a 7-bit SECDED ECC protection scheme. SECDED ECC is calculated per 32-bit data word. Checker/encoder 1000 outputs an error signal that pulses for detected errors.

Figure 11:
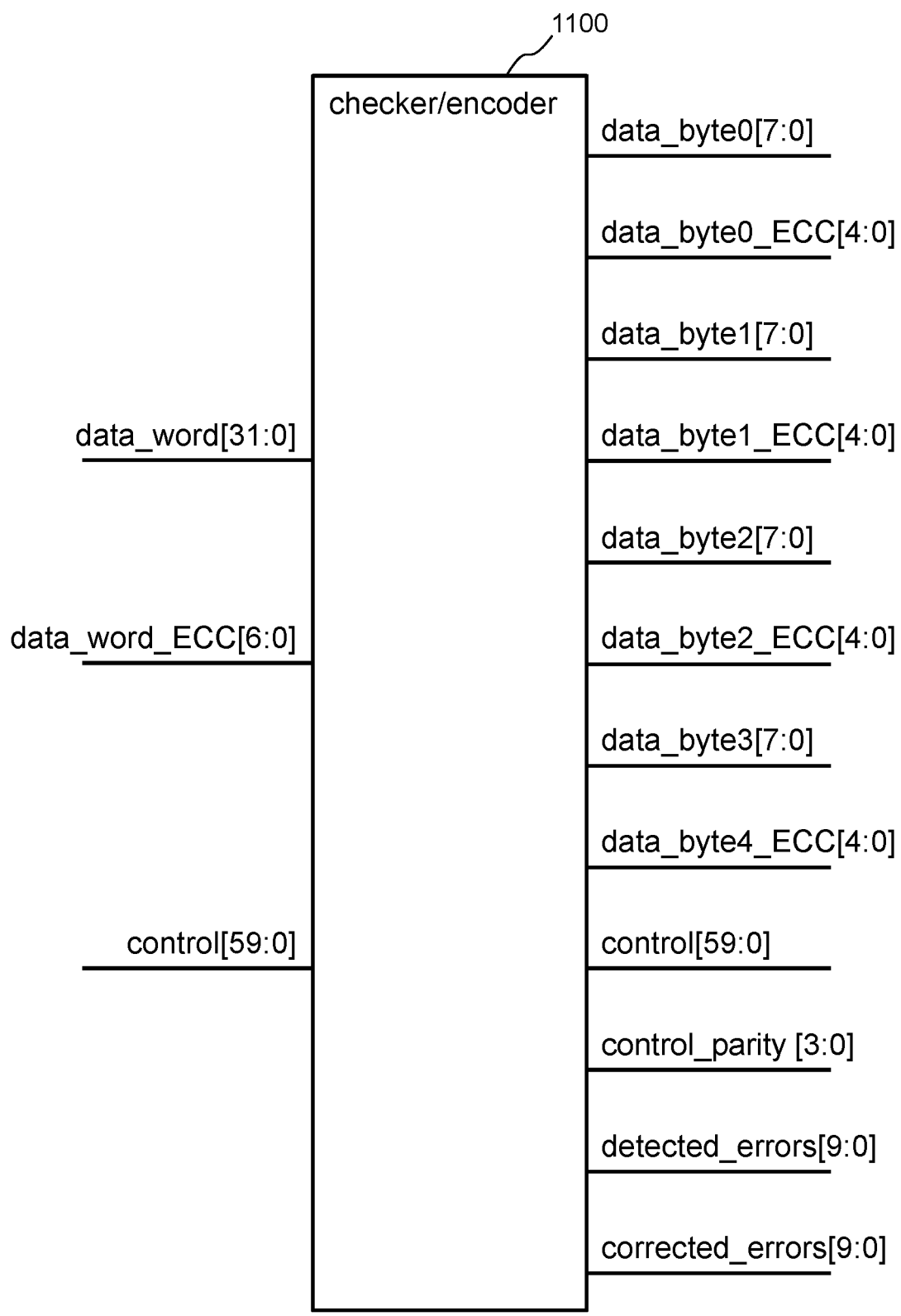
FIG. 11 illustrates a checker/encoder that receives per-word SECDED ECC and control information, and sends per-byte SECDED ECC, control word parity, and counts of detected and corrected errors.

FIG. 11 shows a checker/encoder 1100 according to an embodiment of the invention. It receives and 32-bit data words and sends four data bytes. The receive interface of checker/encoder 1100 uses a 7-bit per-word ECC scheme for the data, and includes a 60-bit unprotected control signal. The sending interface of checker/encoder 1100 uses a 5-bit SECDED ECC protection scheme per data byte. The sending interface also sends a 4-bit parity signal per control word. The checker/encoder 1100 also outputs a 10-bit count signal for detected errors and another 10-bit count signal for corrected errors.

Figure 12:
FIG. 12 illustrates an encoder that receives per-nibble parity and encapsulates it as per-byte information.

FIG. 12 shows an encoder 1200 according to an embodiment of the invention. It receives 32-bit data words and sends 4 separate data bytes. Its receive interface uses a per-word party scheme, with 8 bits per 32-bit data word. The sending interface of encoder 1200 uses a 2-bit parity per byte protection scheme. The encoding of parity bits on the sending interface is an interleaved mapping of the bits of the incoming data word parity. Encoder 1200 does not check for errors.

Some embodiments of physical machines described and claimed herein are programmable in numerous variables, combinations of which provide essentially an infinite variety of operating behaviors. Some embodiments of hardware description language representations described and claimed herein are configured by software tools that provide numerous parameters, combinations of which provide for essentially an infinite variety of physical machine embodiments of the invention described and claimed. Methods of using such software tools to configure hardware description language representations embody the invention described and claimed. Physical machines, such as semiconductor chips; hardware description language representations of the logical or functional behavior of machines according to the invention described and claimed; and one or more non-transitory computer readable media arranged to store such hardware description language representations all can embody machines described and claimed herein.

The behavior of either or a combination of humans and machines; instructions that, if executed by one or more computers, would cause the one or more computers to perform methods according to the invention described and claimed; and one or more non-transitory computer readable media arranged to store such instructions embody methods described and claimed herein. Each of more than one non-transitory computer readable medium needed to practice the invention described and claimed herein alone embodies the invention.

Additionally, it is intended that such equivalents include both currently known equivalents and equivalents developed in the future, i.e., any elements developed that perform the same function, regardless of structure. The scope of the invention, therefore, is not intended to be limited to the exemplary embodiments shown and described herein.

In accordance with the teachings of the invention, a computer and a computing device are articles of manufacture. Other examples of an article of manufacture include: an electronic component residing on a mother board, a server, a mainframe computer, or other special purpose computer each having one or more processors (e.g., a Central Processing Unit, a Graphical Processing Unit, or a microprocessor) that is configured to execute a computer readable program code (e.g., an algorithm, hardware, firmware, and/or software) to receive data, transmit data, store data, or perform methods.

The article of manufacture (e.g., computer or computing device) includes a non-transitory computer readable medium or storage that may include a series of instructions, such as computer readable program steps or code encoded therein. In certain aspects of the invention, the non-transitory computer readable medium includes one or more data repositories. Thus, in certain embodiments that are in accordance with any aspect of the invention, computer readable program code (or code) is encoded in a non-transitory computer readable medium of the computing device. The processor or a module, in turn, executes the computer readable program code to create or amend an existing computer-aided design using a tool. The term "module" as used herein may refer to one or more circuits, components, registers, processors, software subroutines, or any combination thereof. In other aspects of the embodiments, the creation or amendment of the computer-aided design is implemented as a web-based software application in which portions of the data related to the computer-aided design or the tool or the computer readable program code are received or transmitted to a computing device of a host.

An article of manufacture or system, in accordance with various aspects of the invention, is implemented in a variety of ways: with one or more distinct processors or microprocessors, volatile and/or non-volatile memory and peripherals or peripheral controllers; with an integrated microcontroller, which has a processor, local volatile and non-volatile memory, peripherals and input/output pins; discrete logic which implements a fixed version of the article of manufacture or system; and programmable logic which implements a version of the article of manufacture or system which can be reprogrammed either through a local or remote interface. Such logic could implement a control system either in logic or via a set of commands executed by a processor.

Accordingly, the preceding merely illustrates the various aspects and principles as incorporated in various embodiments of the invention. It will be appreciated that those of ordinary skill in the art will be able to devise various arrangements, which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Therefore, the scope of the invention, therefore, is not intended to be limited to the various aspects and embodiments discussed and described herein. Rather, the scope and spirit of invention is embodied by the appended claims.

What is claimed is:

1. A system-on-chip (SoC) comprising:
    a first IP that uses a first protection scheme;
    a second IP that uses a second protection scheme; and
    a Network-on-Chip (NoC) in communication with the first IP and the second IP, the NoC includes:
        a first encoder, the first encoder generates first redundant information and encodes the first redundant information with data using the first protection scheme to generate a first data packet;
        a modification unit in communication with the first encoder, the modification unit changes the first data packet into a modified data packet; and
        a second encoder in communication with the modification unit, the second encoder generates second redundant information and encodes the second redundant information with data using the second protection scheme to generate a second data packet,
    wherein the first protection scheme and the second protection scheme are different and the NoC performs a consistency check and recalculates the second redundant information and produces an updated second redundant information based on the first redundant information to generate an updated second data packet.

2. The system-on-chip of claim 1, wherein the second encoder receives the modified data packet with the packet header changed and encodes the second redundant information according to the second protection scheme.

3. The system-on-chip of claim 1 further comprising an interconnect that is coupled to the first IP and the second IP, the interconnect using a protection scheme that is different from at least one of the first protection scheme and the second protection scheme.

4. The system-on-chip of claim 3 wherein the interconnect includes a unit that modifies packets.

5. The system-on-chip of claim 4 wherein the unit that modifies packets is a serialization adapter.

6. The system-on-chip of claim 5 wherein the output of the serialization adapter is narrower than the input to the serialization adapter.

7. The system-on-chip of claim 1 further comprising a packet-based interconnect, the packet-based interconnect comprising at least one unit including:
  an input for receiving a plurality of first packets; and
  an output for sending a plurality of second packets,
  wherein the at least one unit:
    checks its input according to the first protection scheme;
    changes format of at least one packet selected from the plurality of first packets; and
    encodes its output according to the first protection scheme.

8. At least one non-transient computer readable medium storing hardware description language code for a module that includes:
  a receiving interface for receiving data and first redundant information, the first redundant information and data are encoded using a first protection scheme to generate a first data packet according to the first protection scheme;
  a logic unit in communication with the receiving interface, the logic unit changes the first data packet into a modified data packet and recalculates the first redundant information;
  a sending interface in communication with the logic unit, the sending interface sends data and second redundant information, the second redundant information and data are encoded using a second protection scheme to generate a second data packet according to the second protection scheme and based on the first redundant information, and
  transporting, using a network, protected packets to a checking unit, the checking unit analyzes the protected packets and reports errors,
  wherein the first protection scheme and the second protection scheme are different and in transport the network performs a consistency check and recalculates the second redundant information and produces an updated second redundant information based on the first redundant information to generate an updated second data packet.

9. The at least one non-transient computer readable medium of claim 8 wherein a designer writes hardware description language code.

10. The at least one non-transient computer readable medium of claim 8 further comprising hardware description language code to convert first redundant information according to the first protection scheme to second redundant information according to the second protection scheme.

11. The at least one non-transient computer readable medium of claim 8 further comprising hardware description language code to encapsulate first redundant information according with the first protection scheme.

12. The at least one non-transient computer readable medium of claim 8 further comprising hardware description language code to check the data and first redundant information for errors according with the first protection scheme.

13. The at least one non-transient computer readable medium of claim 12 further comprising hardware description language code to assert an output signal if an error is detected.

14. The at least one non-transient computer readable medium of claim 12 further comprising hardware description language code to count errors.

15. The at least one non-transient computer readable medium of claim 12 further comprising hardware description language code to count correctable errors and hardware description language code to count uncorrectable errors.

16. The at least one non-transient computer readable medium of claim 12 further comprising hardware description language code to generate second redundant information according to the second protection scheme.

17. The at least one non-transient computer readable medium of claim 8 wherein one of the first protection scheme and the second protection scheme is parity and the other of the first protection scheme and the second protection scheme is ECC.

18. The at least one non-transient computer readable medium of claim 8 wherein one of the first protection scheme and the second protection scheme is a first type of ECC and the other of the first protection scheme and the second protection scheme is a second type of ECC.

19. The at least one non-transient computer readable medium of claim 8 wherein at least one of the first protection scheme and the second protection scheme is a SECDED protection scheme.

20. The at least one non-transient computer readable medium of claim 8 wherein at least one of the first protection scheme and the second protection scheme applies redundancy information per flit.

21. The at least one non-transient computer readable medium of claim 8 wherein at least one of the first protection scheme and the second protection scheme applies redundancy information per burst.

22. The at least one non-transient computer readable medium of claim 8 wherein one of the first protection scheme and the second protection scheme applies redundancy per data byte and the other of the first protection scheme and the second protection scheme applies redundancy per multi-byte word.

23. The at least one non-transient computer readable medium of claim 22 wherein parts of the redundant information of the multi-byte word protection scheme are each associated with a different byte of the multi-byte word.

24. The at least one non-transient computer readable medium of claim 23 wherein sideband information is associated with each byte of the multi-byte word.

25. The at least one non-transient computer readable medium of claim 8 wherein the receiving interface has a first number of data bytes and the sending interface has a second number of data bytes and the first number of data bytes and the second number of data bytes are different.

26. The at least one non-transient computer readable medium of claim 8 wherein the receiving interface has a first number of address bits and the sending interface has a second number of address bits and the first number of address bits and the second number of address bits are different.

* * * * *